(12) United States Patent
Hiroki

(10) Patent No.: US 7,637,477 B2
(45) Date of Patent: *Dec. 29, 2009

(54) GATE VALVE APPARATUS OF VACUUM PROCESSING SYSTEM

(75) Inventor: Tsutomu Hiroki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 613 days.

This patent is subject to a terminal disclaimer.

(21) Appl. No.: 11/304,634

(22) Filed: Dec. 16, 2005

(65) Prior Publication Data

US 2006/0182534 A1   Aug. 17, 2006

Related U.S. Application Data

(60) Provisional application No. 60/663,186, filed on Mar. 21, 2005.

(30) Foreign Application Priority Data

Dec. 17, 2004   (JP) ............................ 2004-366470

(51) Int. Cl.
*F16K 31/00* (2006.01)
(52) U.S. Cl. ..................................... 251/163
(58) Field of Classification Search ............... 414/217, 414/935; 251/162, 163, 192, 193; 137/15.23
See application file for complete search history.

(56) References Cited

U.S. PATENT DOCUMENTS

| 6,267,545 | B1 | 7/2001 | Mooring et al. ............ 414/217 |
| 6,698,719 | B2 | 3/2004 | Geiser |
| 6,932,111 | B2 | 8/2005 | Ishigaki |
| 7,281,700 | B2 * | 10/2007 | Hiroki ........................ 251/163 |

FOREIGN PATENT DOCUMENTS

| JP | 8-60374 | 3/1996 |
| JP | 2003-503844 | 1/2003 |

* cited by examiner

*Primary Examiner*—Charles A Fox
(74) *Attorney, Agent, or Firm*—Oblon, Spivak, McClelland, Maier & Neustadt, L.L.P.

(57) ABSTRACT

A gate valve apparatus of a vacuum processing system includes a surrounding wall that defines a transfer space and has a transfer port. A first valve seat is defined around the transfer port. A valve body is movable within the surrounding wall to open/close the transfer port. A first seal member is disposed on the valve body to engage with the first valve seat. A maintenance port is formed in the surrounding wall to perform maintenance of the first seal member. A second valve seat is defined around the maintenance port. A second seal member is disposed around the first seal member on the valve body to engage with the second valve seat. A maintenance cover is detachably attached outside to close the maintenance port. A driving mechanism drives the valve body within the surrounding wall.

17 Claims, 13 Drawing Sheets

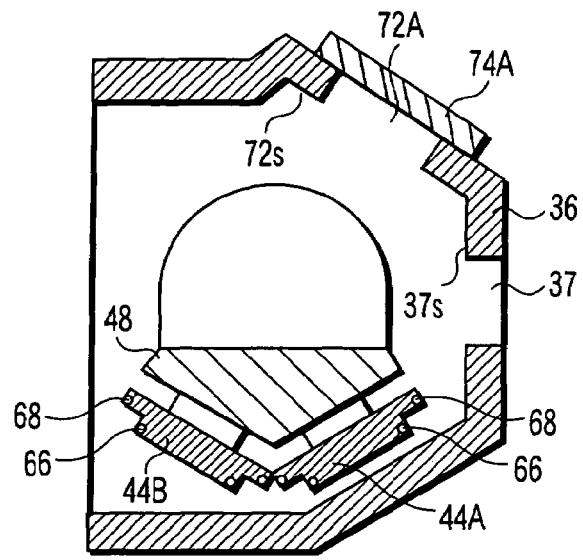
FIG. 13A
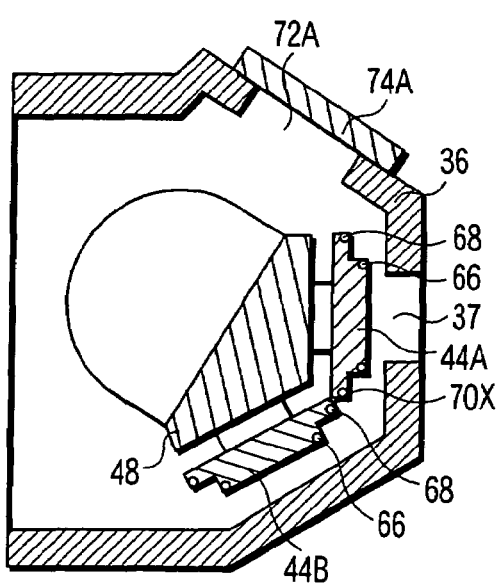 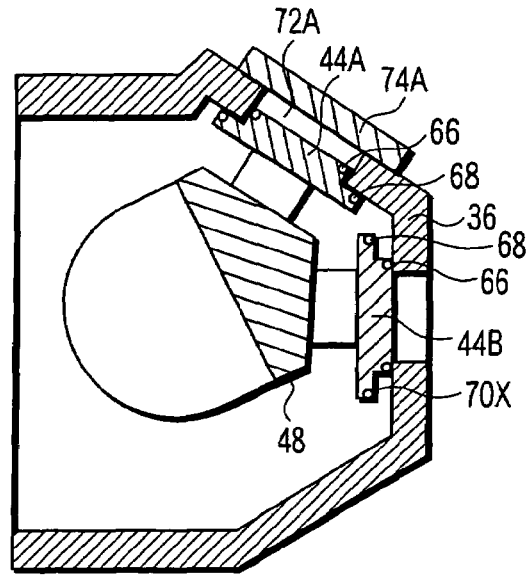
FIG. 13B  FIG. 13C

GATE VALVE APPARATUS OF VACUUM PROCESSING SYSTEM

CROSS-REFERENCE TO RELATED APPLICATIONS

This application claims the benefit of U.S. Provisional Application No. 60/663,186, filed Mar. 21, 2005.

BACKGROUND OF THE INVENTION

1. Field of the Invention

The present invention relates to a gate valve apparatus of a vacuum processing system, to a semiconductor processing system including a plurality of process chambers, and to a method of using the system. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an LCD (Liquid Crystal Display) or FPD (Flat Panel Display), by forming semiconductor layers, insulating layers, and conductive layers in predetermined patterns on the target object.

2. Description of the Related Art

In general, in a fabrication process of a semiconductor device, various processes, such as dry etching, sputtering and CVD (Chemical Vapor Deposition), are repeatedly performed on a semiconductor wafer. Most of these processes are executed in a vacuum atmosphere, and transfer ports for loading/unloading the wafer in process chambers that execute these processes are airtightly sealed by gate valve apparatuses at the time of processes.

Patent Document 1 (Jpn. Pat. Appln. KOKAI Publication No. 8-60374), for instance, discloses an example of this type of gate value apparatus. For example, a transfer port with such a size as to permit passage of a wafer is formed in a side wall of a process chamber that can be evacuated. The transfer port is provided with a gate valve apparatus. At the time of executing a process, the transfer port is airtightly sealed by a valve body with, e.g. an O-ring of the gate valve apparatus.

The above-mentioned processes include a process using a corrosive gas. Even in the case where a corrosive gas is not used in the process, a cleaning process is periodically or nonperiodically performed using an etching gas, which is a corrosive gas, in order to remove various unnecessary films or contaminants adhering to the inside of the process chamber. In this case, a seal member of the gate valve apparatus is exposed to the corrosive gas, and the seal member is degraded, although such degradation progresses little by little. Further, the seal member is put in contact with, or pressed on, a seat surface, resulting in physical degradation such as wear or fatigue. This requires periodical/nonperiodical replacement of the seal member.

A plurality of the above-mentioned process chambers are, in general cases, coupled around a single common transfer chamber via gate valve apparatuses, thereby constituting a so-called "cluster tool". A work for replacing the seal member of the gate valve apparatus is generally performed at the same time as a maintenance work that is performed in a state in which the inside of the process chamber that is disposed continuous to the gate valve apparatus is opened to the outside air. However, since the inside of the process chamber is opened to the outside air and the gate valve apparatus is opened for replacement of the seal member, the inside of the common transfer chamber is also opened to the outside air. At this time, the other process chambers are closed by the associated gate valve apparatuses.

In this case, after the completion of the maintenance work and the replacement of the seal member, each of the transfer chamber and the process chamber is evacuated and restored to a predetermined reduced-pressure atmosphere. However, if these chambers are once opened to the outside air, moisture or various impure gases in the air adhere to, e.g. the inner wall surfaces. A great deal of time for evacuation is needed in order to almost completely eliminate such adhering moisture and impure gases. As a result, a decrease occurs in operation rate of the apparatus and in throughput.

In order to solve this problem, there has been proposed a gate valve apparatus with two valve bodies, as disclosed in Patent Document 2 (PCT National Application Publication No. 2003-503844), for instance. Specifically, two driving mechanisms that are independently operable are disposed within the gate valve apparatus, and these driving mechanisms are provided with valve bodies. When maintenance for the inside of the process chamber is conducted or the seal member on the valve body side, which is exposed to the corrosive gas, is replaced, the port on the side of the common transfer chamber is airtightly sealed by the other valve body. Thereby, even if the inside of the process chamber is opened to the outside air, the inside of the transfer chamber can be kept in a vacuum state.

In this conventional gate valve apparatus, however, two sets of the valve body and driving mechanism have to be provided, resulting in a complex whole structure and an increase in size of the apparatus. Besides, when the seal member is replaced, it is necessary to disassemble the casing of the gate valve apparatus, etc. Consequently, the replacement work itself becomes a large-scale, time-consuming work. Furthermore, when the seal member is to be replaced, the inside of the gate valve apparatus has to be opened to the outside air. This causes the inside of the gate valve apparatus to be contaminated or increases the time necessary for evacuating the inside of the gate valve apparatus after the replacement work. In other words, the seal member cannot be replaced unless the inside of the process chamber is opened to the outside air.

BRIEF SUMMARY OF THE INVENTION

An object of the present invention is to make it possible to replace a seal member in a gate valve apparatus of a vacuum processing system, without a need to open an associated chamber to outside air.

According to a first aspect of the present invention, there is provided a gate valve apparatus of a vacuum processing system, comprising:

a surrounding wall that defines a transfer space for a target object to pass therethrough;

a transfer port formed in the surrounding wall for the target object to pass therethrough;

a first valve seat defined by a part of the surrounding wall, which surrounds the transfer port;

a valve body disposed to be movable within the surrounding wall and to open/close the transfer port;

a first seal member disposed on the valve body to engage with the first valve seat;

a maintenance port formed in the surrounding wall to perform maintenance of the first seal member;

a second valve seat defined by a part of the surrounding wall, which surrounds the maintenance port;

a second seal member disposed on the valve body to engage with the second valve seat, the second seal member surrounding the first seal member;

a maintenance cover detachably attached on an outside of the surrounding wall to close the maintenance port; and a driving mechanism that drives the valve body within the surrounding wall.

According to a second aspect of the present invention, there is provided a gate valve apparatus to be disposed in a surrounding wall that defines a transfer space for a target object to pass therethrough, in a vacuum processing system, wherein the surrounding wall comprises a transfer port formed in the surrounding wall for the target object to pass therethrough, a first valve seat defined by a part of the surrounding wall, which surrounds the transfer port, a maintenance port formed in the surrounding wall to perform maintenance of the gate valve apparatus, a second valve seat defined by a part of the surrounding wall, which surrounds the maintenance port, and a maintenance cover detachably attached on an outside of the surrounding wall to close the maintenance port, the gate valve apparatus comprising:

a valve body disposed to be movable within the surrounding wall and to open/close the transfer port;

a first seal member disposed on the valve body to engage with the first valve seat;

a second seal member disposed on the valve body to engage with the second valve seat, the second seal member surrounding the first seal member; and a driving mechanism configured to drive the valve body within the surrounding wall.

According to a third aspect of the present invention, there is provided a semiconductor processing system comprising:

a pressure-adjustable common transfer chamber that has a plurality of side surfaces;

pressure-adjustable first and second process chambers that are connected to two of the plurality of side surfaces to perform a semiconductor process on the target object;

a transfer mechanism provided within the common transfer chamber to load/unload the target object into/from the first and second process chambers; and gate valve apparatuses that are provided, respectively, between the common transfer chamber and the first process chamber and between the common transfer chamber and the second process chamber, wherein each of the gate valve apparatuses is the gate valve apparatus according to the above-described first aspect of the invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 13A to 13C are views for explaining an operation of a gate valve apparatus according to a seventh embodiment of the present invention.

DETAILED DESCRIPTION OF THE INVENTION

Figure 1:
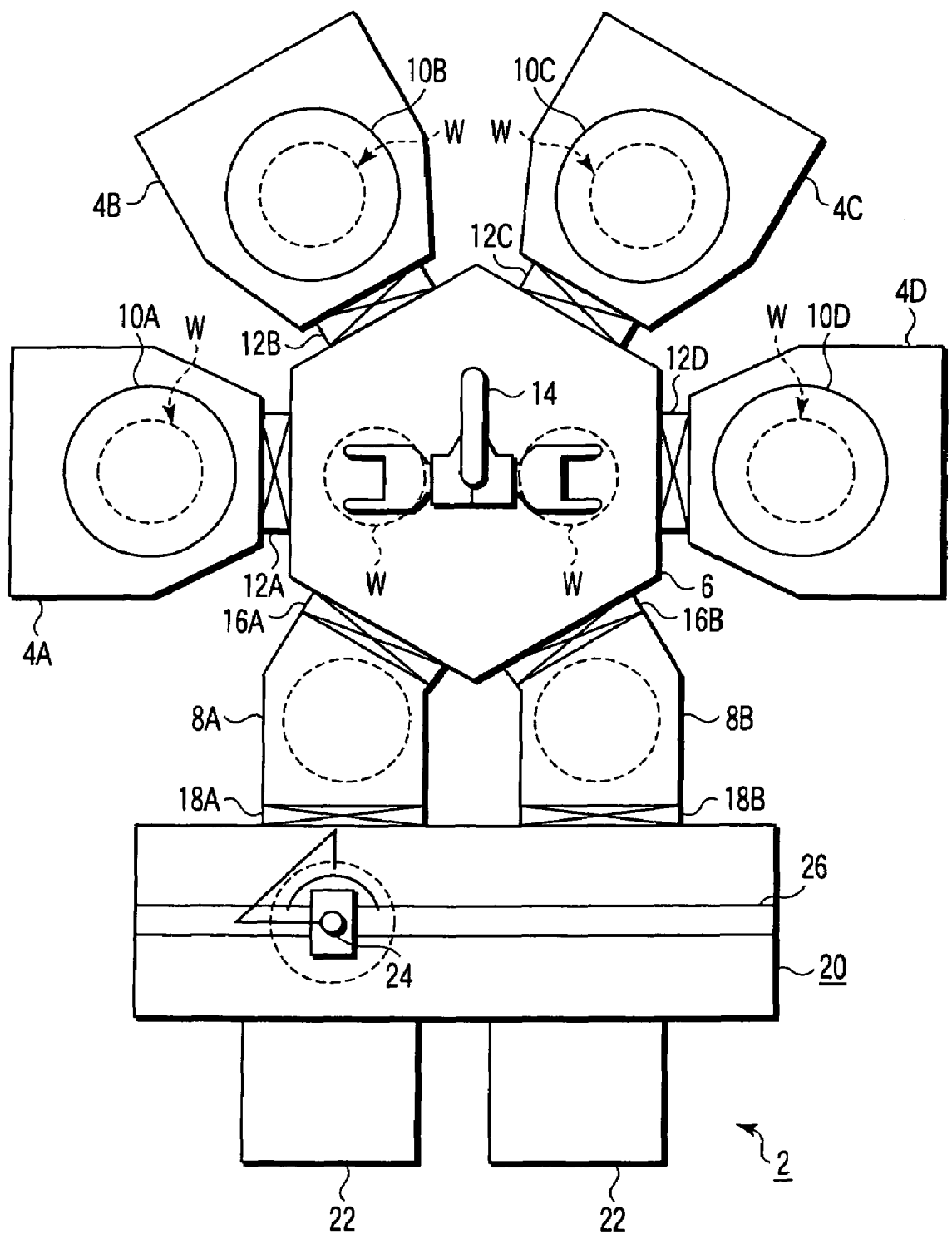
FIG. 1 is a plan view that shows a processing system using a gate valve apparatus according to an embodiment of the present invention.

Embodiments of the present invention will now be described with reference to the accompanying drawings. In the description below, the structural elements, which have substantially the same functions and structures, are denoted by like reference numerals, and an overlapping description is given only where necessary.

FIG. 1 is a plan view that shows a processing system using a gate valve apparatus according to an embodiment of the present invention. As is shown in FIG. 1, the processing system 2 includes a hexagonal common transfer chamber 6. Four process chambers 4A, 4B, 4C and 4D and two load-lock chambers 8A and 8B are connected to the common transfer chamber 6.

Specifically, each process chamber, 4A to 4D, is constructed such that the inner pressure thereof is adjustable by gas feeding and evacuation. Each process chamber, 4A to 4D, includes a mount table 10A, 10B, 10C, 10D for mounting of a semiconductor wafer W that is a target object. In the state in which the wafer W is placed on the mount table, various processes are performed. In general, these various processes are performed in a vacuum atmosphere. However, in some cases, the process is performed under a normal pressure, depending on the kind of the process. The respective process chambers 4A to 4D are connected to the corresponding sides of the transfer chamber 6 via gate valve apparatuses 12A, 12B, 12C and 12D.

The common transfer chamber 6 is also constructed such that the inner pressure thereof is adjustable by gas feeding and evacuation. A transfer mechanism 14, which is retractable/extendible and is rotatable in order to transfer the wafer W, is disposed within the transfer chamber 6. The transfer mechanism 14 can load/unload the wafer W into/from the process chambers 4A to 4D via the gate valve apparatuses 12A to 12D that are opened.

Two load-lock chambers 8A and 8B are connected to the transfer chamber 6 via gate valve apparatuses 16A and 16B. The load-lock chamber 8A, 8B is also constructed such that the inner pressure thereof is adjustable by gas feeding and evacuation. The load-lock chamber 8A, 8B is connected to a loader module 20 via the gate valve apparatus 18A, 18B. The loader module 20 is provided with ports 22 in which cassettes that contain a plurality of wafers W are disposed. A transfer arm mechanism 24, which is retractable/extendible and is rotatable, is disposed within the loader module 20 so as to be able to run along a guide rail 26. The transfer arm mechanism 24 can take in the wafer W from the cassette, which is placed in the port 22, and can transfer it to the load-lock chamber 8A, 8B. The wafer W in the load-lock chamber 8A, 8B is taken in by the transfer mechanism 14 within the transfer chamber 6 and is loaded into the process chamber, 4A to 4D, as described above. When the wafer W is to be unloaded, it is unloaded through a path in a direction opposite to the direction of loading.

Figure 2:
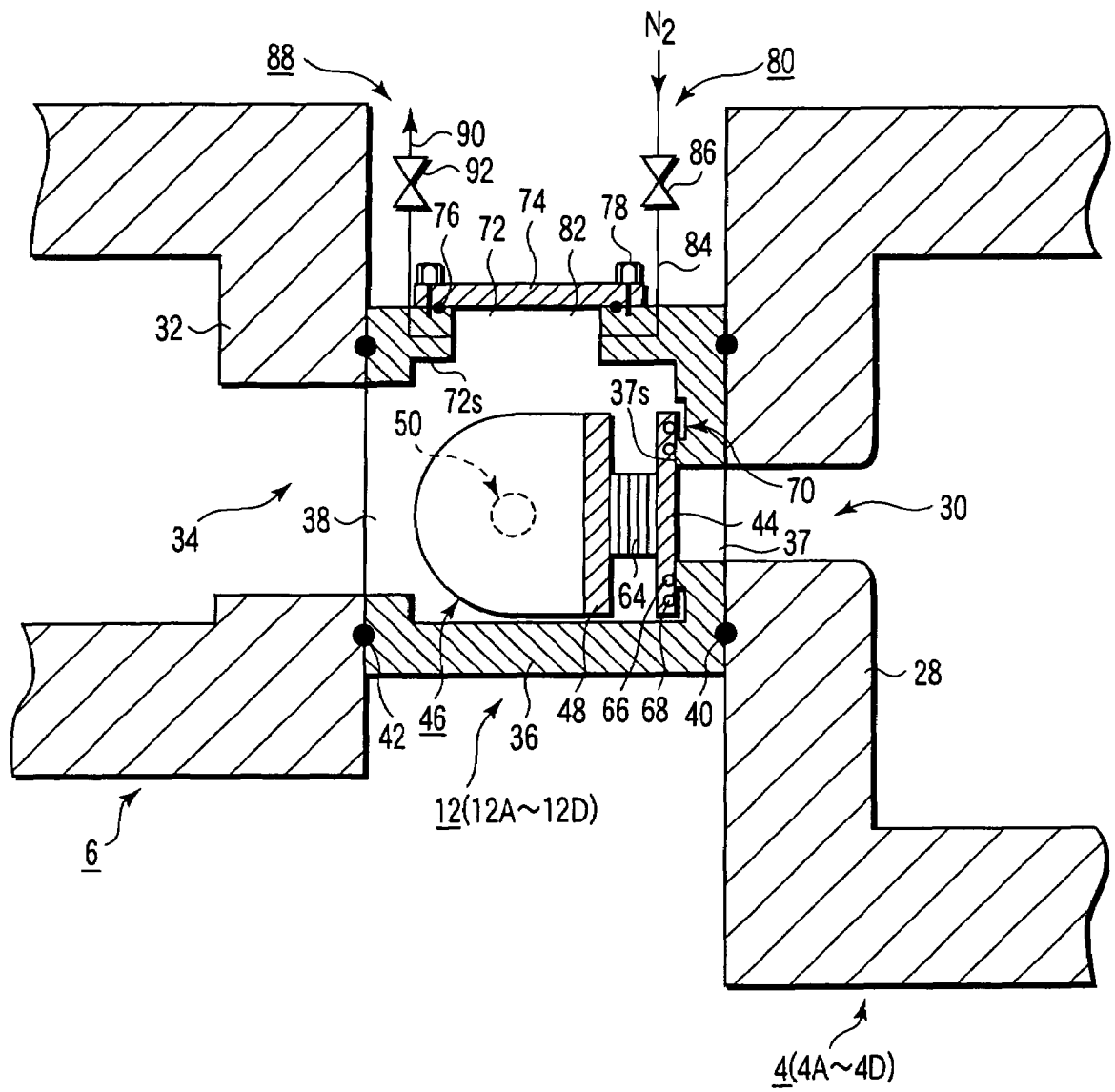
FIG. 2 is an enlarged cross-sectional view that shows a gate valve apparatus according to a first embodiment of the invention.
Figure 3:
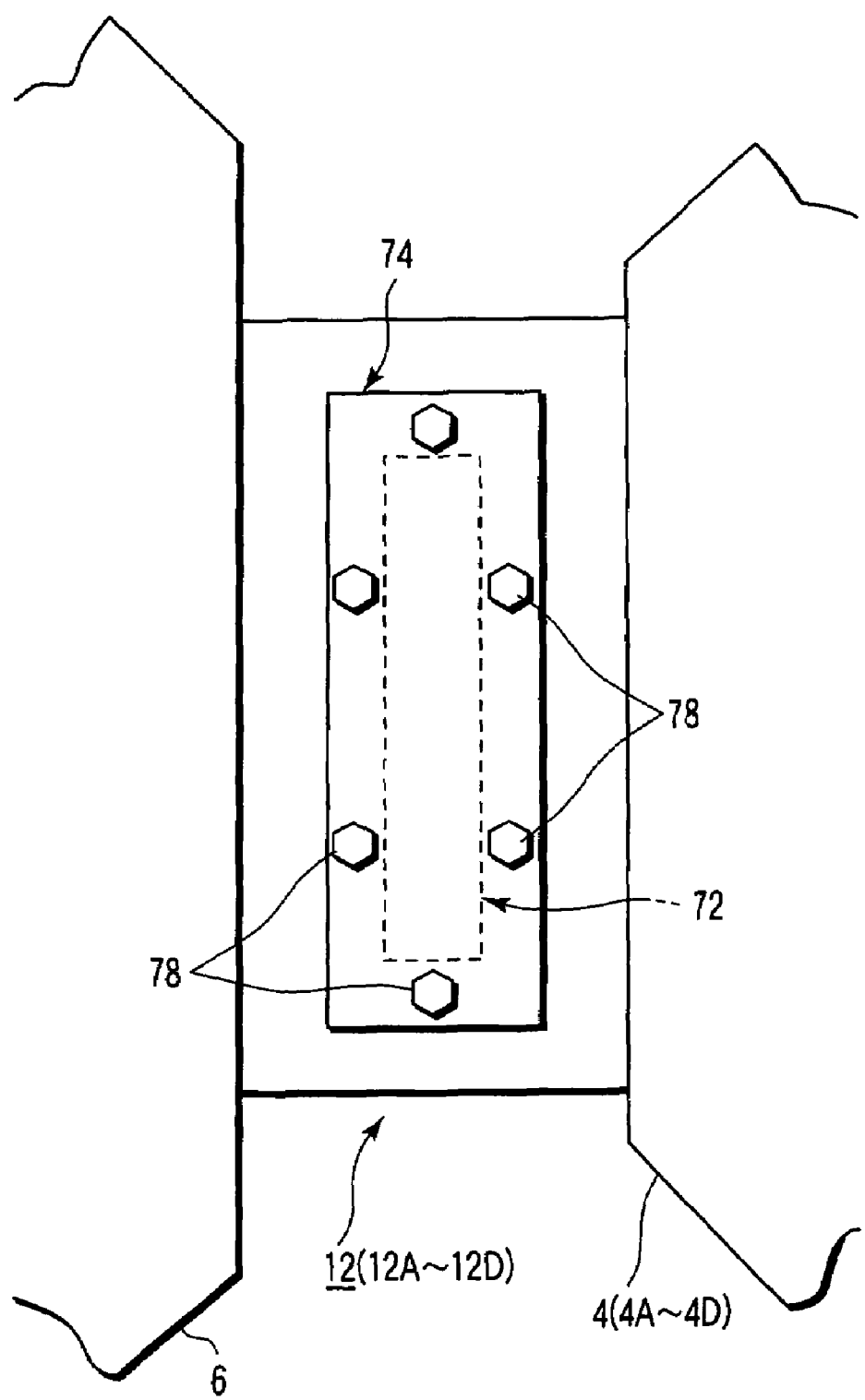
FIG. 3 is a top view of the gate valve apparatus shown in FIG. 2.

Next, the gate valve apparatuses 12A to 12D, which are provided between the transfer chamber 6 and the process chambers 4A to 4D, are described. Since the gate valve apparatuses 12A to 12D have the same structure, these are representatively referred to as "gate valve apparatus 12", and the process chambers 4A to 4D are representatively referred to as "process chamber 4". FIG. 2 is an enlarged cross-sectional view that shows a gate valve apparatus according to a first embodiment of the invention. FIG. 3 is a top view of the gate valve apparatus shown in FIG. 2.

As is shown in FIG. 2, an elongated port 30, through which the wafer W is loaded/unloaded, is formed in a side wall 28 that defines the process chamber 4. In addition, a port 34 is formed in a side wall 32 that defines the transfer chamber 6. The gate valve apparatus 12 has a casing 36 that forms an outer shell, that is, defines a transfer space through which the wafer W is passed. The casing 36 is a substantially cubic body that is formed of, e.g. aluminum, and the casing 36 has a substantially square cross section. An elongated transfer port 37 that communicates with the inside of the process chamber 4 is formed on one side of the casing 36. An elongated port 38 that communicates with the inside of the transfer chamber 6 is formed on the opposite side of the casing 36. O-rings 40 and 42 for keeping airtightness are provided at interfaces between the casing 36 and the process chamber 4 and transfer chamber 6. Within the casing 36, a valve body 44 for airtightly closing the transfer port 37 is attached to a driving mechanism 46. Since the transfer port 37 and transfer port 30 integrally communicate with each other, the transfer port 30 is opened/closed by opening/closing the transfer port 37.

Figure 4:
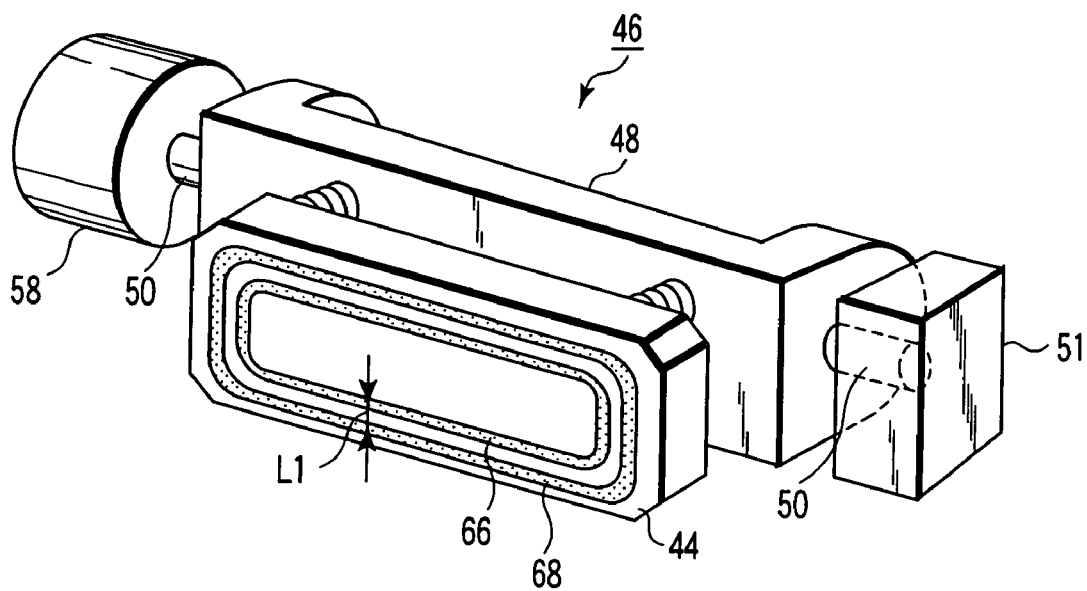
FIG. 4 is a perspective front view that shows a valve body and a driving mechanism of the gate valve apparatus shown in FIG. 2.
Figure 5:
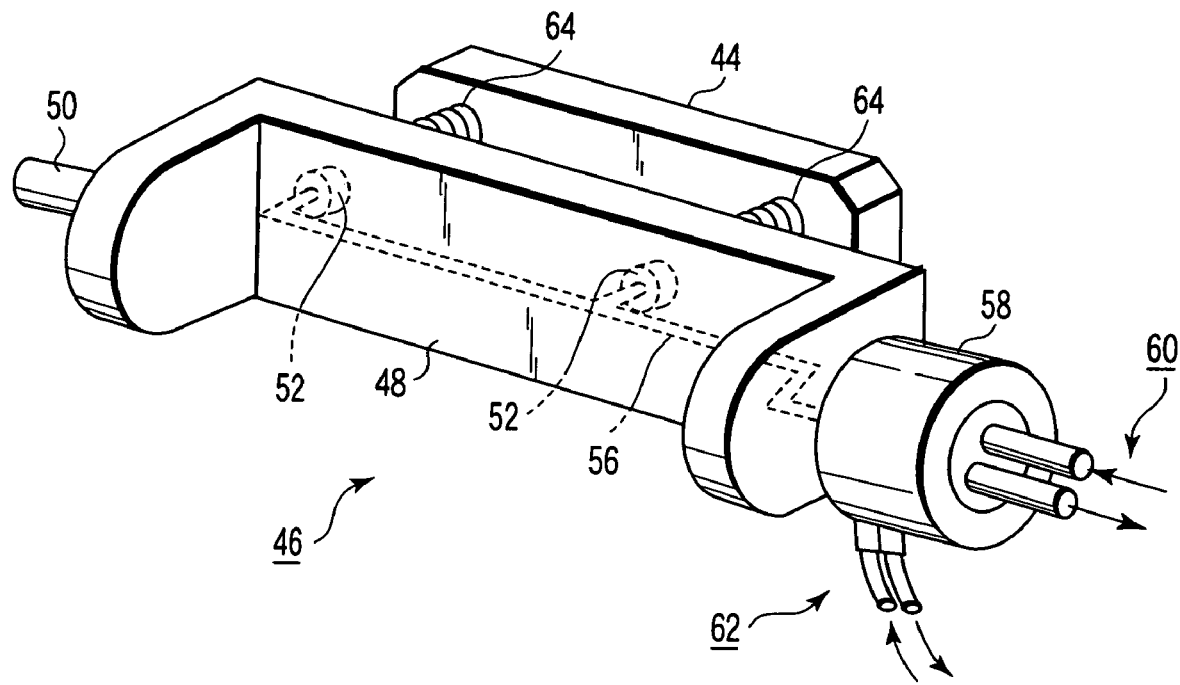
FIG. 5 is a perspective rear view that shows the valve body and driving mechanism of the gate valve apparatus shown in FIG. 2.

FIG. 4 is a perspective front view that shows the valve body and the driving mechanism of the gate valve apparatus shown in FIG. 2. FIG. 5 is a perspective rear view that shows the valve body and driving mechanism of the gate valve apparatus shown in FIG. 2. As is shown in FIGS. 4 and 5, the driving mechanism 46 includes a U-shaped portion 48. Shafts extend outward from both ends of the base portion 48. The shafts 50 airtightly penetrate side walls in the longitudinal direction of the casing 36, and are rotatably supported. A magnetic fluid seal (not shown), for instance, is provided at the penetrating portion of each shaft 50, and rotation of the shaft 50 is permitted while sealing is being maintained.

Two reciprocators 52, which are composed of, e.g. air cylinders, are disposed in parallel to each other on the base portion 48. A plate-shaped valve body 44 is attached to distal ends of the reciprocators 52. By extending/retracting the reciprocators 52, the valve body 44 can be advanced/retreated. Since the extension/retraction driving of the reciprocators 52 is executed by compressed air, a gas flow passage 56 that communicates with the reciprocators 52 is formed in the base portion 48. The gas flow passage 56 is led to the outside through one of the shafts 50. A rotary actuator 58 that is driven by compressed air is attached to the shaft 50 in which the gas flow passage 56 is formed. The rotary actuator 58 is provided with a gas port 60 for extending/retracting the reciprocators 52 and a gas port 62 for rotating the base portion 48 clockwise/counterclockwise by a predetermined angle. In short, the extension/retraction of the reciprocators 52 and the rotation of the base portion 48 can be executed where necessary.

As will be described later, the base portion 48 is rotated between a first position where the valve body 44 is made to face the transfer port 37, and a second position where the valve body 44 is made to face a maintenance port 72 (to be described later). The base portion 48 is configured such that when the base portion 48 is in the second position, the base portion 48 does not interfere with the wafer that is passed through the transfer space via the transfer port 37. An extendible/retractable metallic bellows 64 is disposed so as to surround each reciprocator 52. The bellows 64 prevents compressed air from leaking out, while permitting extension/retraction of the reciprocator 52.

A first seal member 66 having a thin annular shape, which is formed of, e.g. an O-ring, is provided on a front surface of the valve body 44 in order to seal the inside of the process chamber 4. The first seal member 66 airtightly contacts a first valve seat 37s that is defined by an inner surface portion of the casing 36 surrounding the transfer port 37, thereby surely sealing the transfer port 37. A second seal member 68, which is formed of, e.g. an O-ring, is provided on the valve body 44 so as to surround the first seal member 66 with a predetermined distance L1. In short, the first and second seal members 66 and 68 are concentrically arranged in a two-lane fashion. The predetermined distance L1 is set at, e.g. about 5 to 20 mm.

Around the first valve seat 37s, a recess portion 70 having a thin annular shape is formed in the inner surface of the casing 36 in a circumferential direction of the transfer port 37. The recess portion 70 is formed so as to prevent contact between the second seal member 68 and the inner surface of the casing 36 when the valve body 44 is seated on the transfer port 37. This prevents unnecessary degradation (wear or fatigue) of the second seal member 68.

An elongated maintenance port 72 for replacement of the first seal member 66 provided on the inside of the valve body 44 is formed in a ceiling part of the casing 36. A second valve seat 72s is defined by an inner surface portion of the casing 36, which surrounds the maintenance port 72. When the maintenance port 72 is closed by the valve body 44, only the second seal member 68 is put in close contact with the second valve seat 72s. In other words, the maintenance port 72 is made slightly wider than the transfer port 37. Thereby, the maintenance port 72 is airtightly sealed by the second seal member 68 while the inner first seal member 66 is exposed in the maintenance port 72.

The maintenance port 72 is airtightly sealed by a maintenance cover 74 via an O-ring 76. The maintenance cover 74 is attached to the outside of the casing 36. The maintenance cover 74 is detachably attached by a plurality of bolts 78. The maintenance cover 74 is formed of a transparent plate such as an acrylic resin plate, or is formed to have a transparent viewing window at a part thereof. Thereby, the degree of degradation of the first seal member 66 can visually be recognized from the outside, without the need to detach the maintenance cover 74.

A gas feeding system 80 and an evacuation system 88 are connected to the maintenance port 72 in order to adjust a pressure within a space 82 (see FIG. 6E), which is defined between the maintenance cover 74 and the valve body 44 when the second seal member 68 is put in close contact with the second valve seat 72s. Specifically, as shown in FIG. 2, the gas feeding system 80 includes a flow path 84 that is formed in a wall portion around the maintenance port 72 and allows communication between the space 82 (corresponding to the region of the maintenance port 72) and the outside. A gas supply system (not shown), which supplies, e.g. $N_2$ gas or clean air, when necessary, via an opening/closing valve 86, is connected to the flow path 84. Alternatively, for example, a relief valve that is manually or automatically operated may be provided on the maintenance cover 74 as the gas feeding system 80.

The evacuation system 88 includes a flow path 90 that is formed in a wall portion around the maintenance port 72 and allows communication between the space 82 and the outside. A vacuum evacuation pump (not shown), which evacuates an atmosphere within the space 82, when necessary, via an opening/closing valve 92, is connected to the flow path 90. Alternatively, for example, an air operation valve that is automatically opened/closed may be provided at the maintenance port 72 as the evacuation system 88, thereby to allow communication between the space 82 and the inside of the casing 36.

Alternatively, the two flow paths 84 and 90 may commonly be formed using, e.g. a three-way valve. By switching the three-way valve, the feeding of $N_2$ gas or clean air or the evacuation can selectively be executed.

FIGS. 6A to 6F are views for explaining an operation of the gate valve apparatus shown in FIG. 2. FIGS. 6A to 6F show only main parts of the above-described gate valve apparatus 12 in a simplified manner.

As has been described above, in order to change the direction of the valve body 44 of the gate valve apparatus 12, the base portion 48 is rotated clockwise or counterclockwise by a predetermined angle, thereby turning the valve body 44 upward or sideward, as illustrated in FIGS. 6A to 6F (the gas port 62 shown in FIG. 5 is used). Besides, in order to advance or retract the valve body 44, the reciprocators 52, which are composed of, e.g. air cylinders, are extended/retracted (the gas port 60 shown in FIG. 5 is used). The driving mechanism 46 is provided with a lock mechanism 51 for locking the base portion 48 at respective stop positions. The lock mechanism 51 secures safety, in particular, at the time of replacement of the seal member, as will be described later.

Figure 6A:
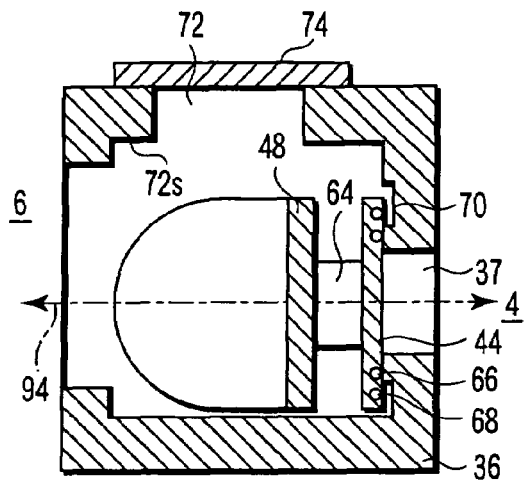
FIGS. 6A to 6F are views for explaining an operation of the gate valve apparatus shown in FIG. 2.
Figure 6B:
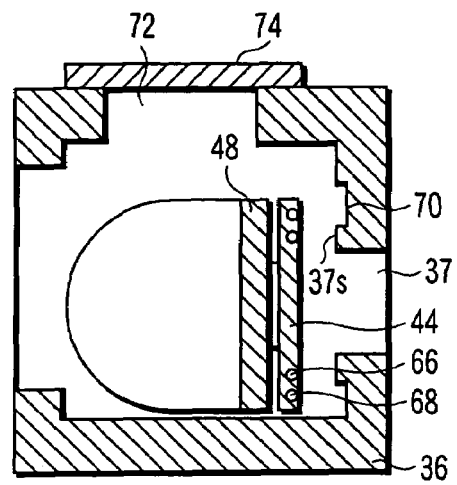
Figure 6C:
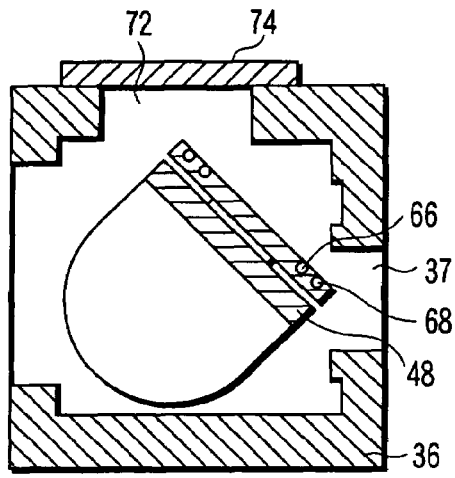
Figure 6D:
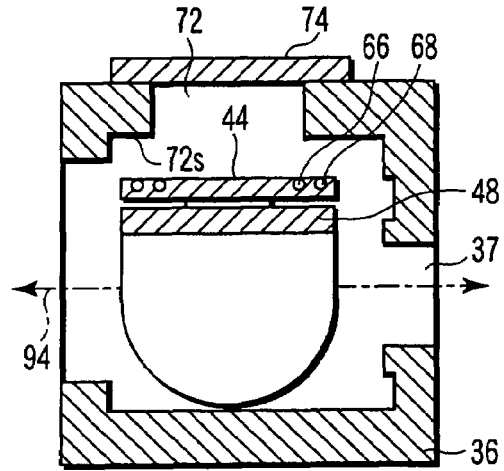

When the wafer W is loaded in the process chamber 4 from the transfer chamber 6, or when the wafer W is unloaded from the process chamber 4 to the transfer chamber 6, the valve body 44 is retracted and, in this state, the base portion 48 is turned upward, as shown in FIG. 6D. Thereby, the transfer port 37 is opened, and a traveling locus 94 of the wafer W is not interrupted, so the wafer W can be transferred along the traveling locus 94. In this case, the transfer chamber 6 is always kept in a vacuum. The transfer chamber 6 and process chamber 4 are made to communicate with each other after a difference in pressure between both chambers is set to a predetermined value or less.

When a process of, e.g. film formation is performed, the base portion 48 is turned sideward, as shown in FIG. 6A, and the valve body 44 is advanced and seated on the transfer port 37. Thus, the first seal member 66 provided on the valve body 44 contacts the first valve seat 37s, and the transfer port 37 is airtightly sealed. Thereby, the inside of the process chamber 4 is set in the closed state and, in this state, a prescribed process or cleaning is performed in the process chamber 4. At this time, the second seal member 68 provided on the outside of the first seal member 66 faces the recess portion 70 provided around the first valve seat 37s in a non-contact state. Hence, the second seal member 68 is not deformed uselessly, and degradation of the second seal member 68 due to deformation can be prevented. In the meantime, the recess portion 70 may not be provided, and a generally flat seat surface with no stepped part may be formed.

Figure 6E:
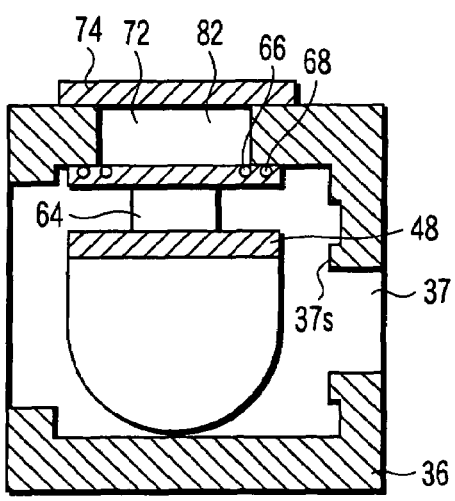
Figure 6F:
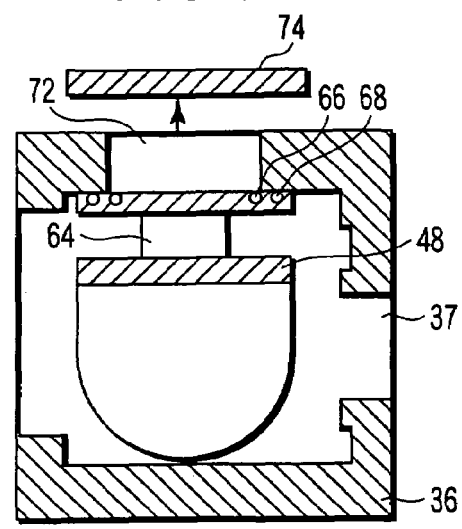
Figure 7:
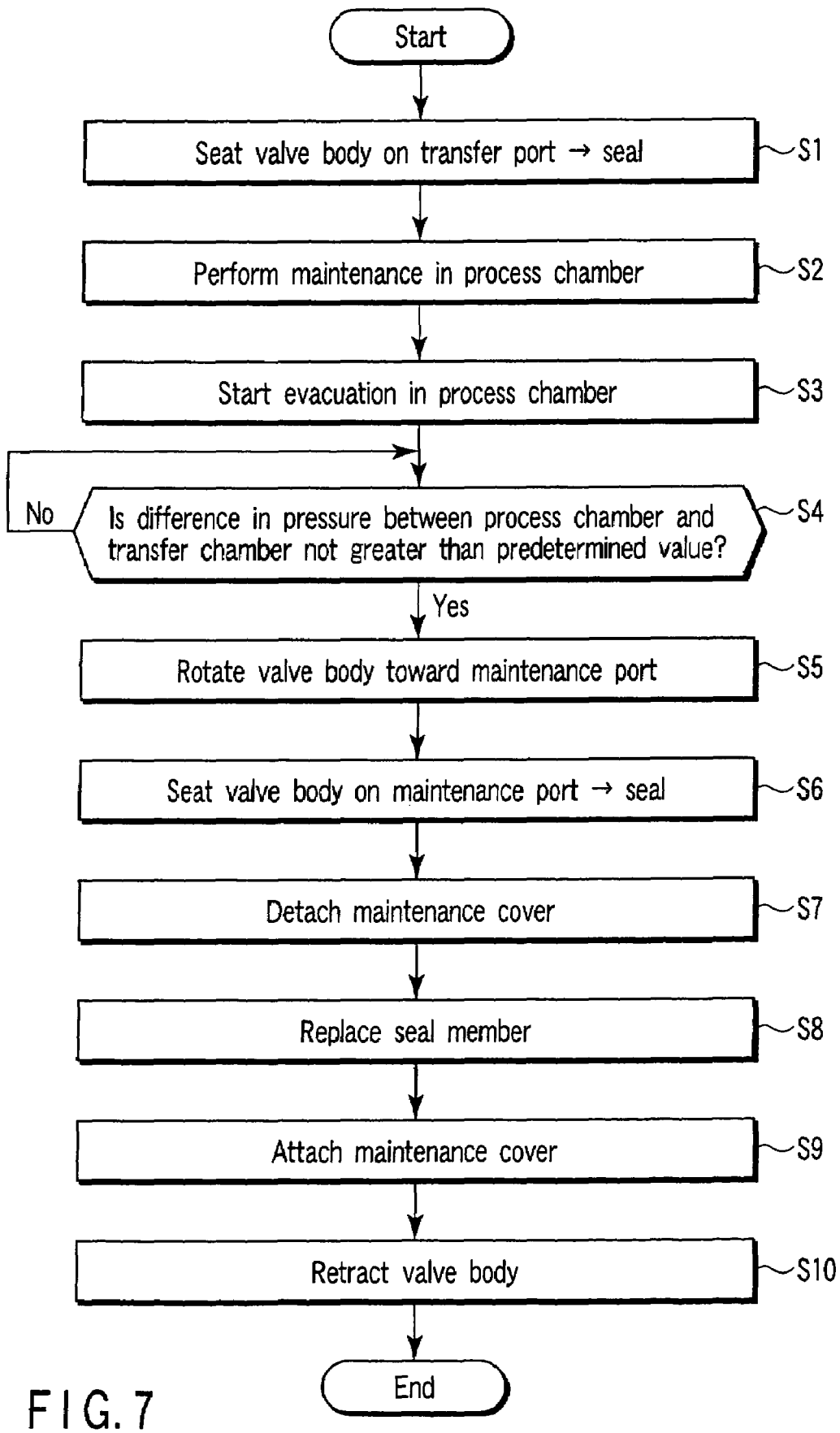
FIG. 7 is a flow chart illustrating a method of replacing a seal member of the gate valve apparatus shown in FIG. 2.

FIG. 7 is a flow chart illustrating a method of replacing the seal member of the gate valve apparatus shown in FIG. 2. Referring now to FIGS. 6A to 6F and FIG. 7, the method of replacing the first seal member 66 of the gate valve apparatus 12 is described.

Replacement of the first seal member 66 is performed at the same time as maintenance of the inside of the process chamber 4. In this case, too, the transfer chamber 6 is evacuated and the inside of the chamber 6 is kept in a predetermined reduced-pressure atmosphere (in a vacuum state). In addition, the inside of the gate valve apparatus 12, which always communicates with the transfer chamber 6, is kept in a reduced-pressure atmosphere.

To start with, as shown in FIG. 6A, prior to maintenance of the process chamber 4, the valve body 44 is seated on the transfer port 37 and thus airtightly seals the transfer port 37 (step S1). Thereby, communication between the process chamber 4 and the transfer chamber 6 is shut off. In this state, the inside of the process chamber 4 is opened to the outside air, and necessary maintenance, such as replacement of an electrode or replacement of an internal component, is performed (step S2).

Following the completion of the maintenance work, the process chamber is reassembled, and evacuation of the process chamber 4, which is in an atmospheric pressure, is begun and the pressure within the process chamber 4 is gradually reduced (step S3). While the process chamber 4 is being evacuated, the difference in pressure between the inside of the process chamber 4 and the inside of the transfer chamber 6 is measured by a pressure meter (not shown) and it is determined whether the difference in pressure reaches a predetermined value or less (step S4).

If the difference in pressure reaches the predetermined value or less (YES in step S4), the possibility of involving of particles decreases to substantially zero. Thus, the valve body 44 is retreated, as shown in FIG. 6B. As a result, the transfer port 37 is opened, and the process chamber 4 and transfer chamber 6 are restored to the state in which the inside of the process chamber 4 communicates with the inside of the transfer chamber 6 in a reduced-pressure atmosphere. Subsequently, as shown in FIGS. 6C and 6D, the base portion 48 is gradually rotated over, e.g. 90°, and the valve body 44 is turned toward the maintenance port 72 (step S5). In this case, too, evacuation is continued for a long time in the process chamber 4 in order to eliminate moisture or unnecessary gas adhering to the wall surfaces.

Then, as shown in FIG. 6E, the valve body 44 is advanced and seated on the maintenance port 72, thus airtightly sealing the maintenance port 72 (step S6). In this case, since the maintenance port 72 is formed slightly larger than the transfer port 34, the outer second seal member 68 contacts the second valve seat 72s. On the other hand, the inner first seal member 66, which is degraded, is exposed in the maintenance port 72.

At this time, a closed space 82, although being small, is defined between the valve body 44 and the maintenance cover 74. If the maintenance cover 74 is detached quickly, a vacuum in the space 82 is lost at a time, leading to dispersion of particles, etc. To avoid this, prior to detaching the maintenance cover 74, the gas feeding system 80 shown in FIG. 2 is activated to feed, e.g. $N_2$ gas into the space 82, thereby setting the space 82 in an atmospheric-pressure state. In the case where the relief valve is provided as the gas feeding system 80, the relief valve may manually be opened to set the space 82 in the atmospheric-pressure state.

In this way, if the space 82 has transitioned into the atmospheric-pressure state, the bolts 78 shown in FIGS. 2 and 3 are loosened and the maintenance cover 74 is detached as shown in FIG. 6F (step S7). Thereby, the maintenance port 72 is opened to the outside air.

Thereafter, a maintenance worker replaces the degraded first seal member 66, which is exposed in the maintenance port 72, with a new seal member (step S8). In this case, when the maintenance worker attaches the new seal member, he/she strongly presses the valve body 44. However, since the driving mechanism 46 is set in the locked state by the lock mechanism 51 that is activated, the safety for the work is secured.

If the replacement procedure for the first seal member 66 is completed, the maintenance cover 74 is attached once again and fixed by the bolts 78 (step S9). The state at this time is shown in FIG. 6E. At this time, contrary to the above-described case, the space 82 is in the atmospheric-pressure state. If the valve body 44 is retreated in this state, outside air containing moisture, etc., although the quantity thereof is small, diffuses into the process chamber 4 or into the transfer chamber 6. Thus, when the valve body 44 is to be retreated, the evacuation system 88 shown in FIG. 2 is driven and the atmospheric-pressure gas in the space 82 is evacuated. If evacuation is performed for a certain length of time, the valve body 44 is retreated and spaced apart from the maintenance port 72 (step S10). The state at this time is shown in FIG. 6D. Thereby, the replacement work for the first seal member 66 is completed.

As has been described above, the replacement work for the first seal member 66 can be performed while a vacuum is maintained in the transfer chamber 6 and process chamber 4. In this case, since a vacuum state in the transfer chamber 6 that has a greater capacity than the process chamber 4 can be maintained, the operation rate of the processing system can remarkably be enhanced.

The replacement work for the first seal member 66 is completed in about several ten minutes. On the other hand, the evacuation driving for eliminating, e.g. moisture in the process chamber 4 that is once opened to outside air, that is, so-called "depleting driving", requires several hours to ten-odd hours. Thus, if the replacement work for the first seal member 66 is performed during the depleting driving, the halt time of the whole processing system can be reduced, and the operation rate of the processing system can be increased.

Furthermore, at the time of replacing the first seal member 66, there is no need to disassemble the gate valve apparatus to a large scale. Only by detaching the maintenance cover 74, the replacement work for the first seal member 66 can be performed. Accordingly, the work efficiency is enhanced, and the replacement work can quickly be performed.

Besides, since only one valve body and only one driving system are provided, the structure of the whole apparatus is simplified and the size of the whole apparatus is reduced. Therefore, the reduction in size of the apparatus is realized.

FIGS. 8A to 8F are views for explaining an operation of a gate valve apparatus according to a second embodiment of the present invention. FIGS. 8A to 8F show only main parts of the gate valve apparatus.

In the first embodiment, the recess portion 70 is formed around the first valve seat 37s of the transfer port 37, and the second seal member 68 is prevented from contacting the inner surface of the casing when the valve body 44 is seated. In the second embodiment, a stepped recess portion 70X, which is designed to achieve the same purpose, is formed at a peripheral portion of the valve body 44 so as to surround the first seal member 66 of the valve body 44. In the other respects, the structure of the second embodiment is the same as that of the first embodiment.

Specifically, the thickness of the valve body 44 is slightly increased, and a peripheral portion of the valve body 44 is formed in a stepped shape. Thus, the stepped recess portion 70X is formed at the peripheral portion. The second seal member 68 is provided on the stepped recess portion 70X. In addition, the first seal member 66 is provided on a central projecting portion of the valve body 44. The projecting portion, as shown in FIGS. 8E and 8F, is formed such that it is received in the maintenance port 72.

Figure 8A:
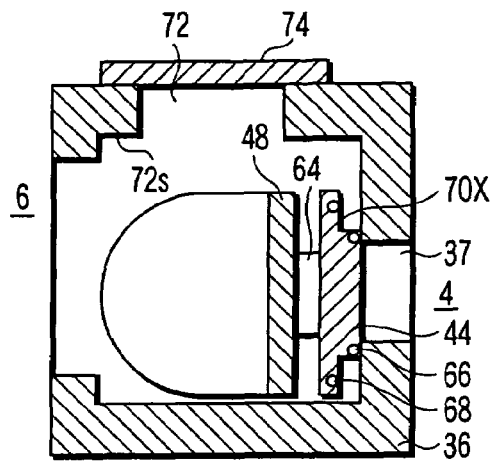
FIGS. 8A to 8F are views for explaining an operation of a gate valve apparatus according to a second embodiment of the present invention.
Figure 8B:
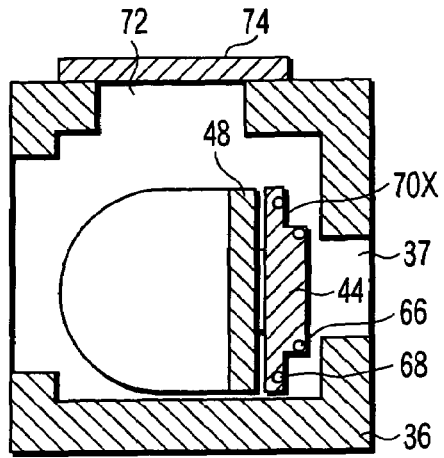
Figure 8C:
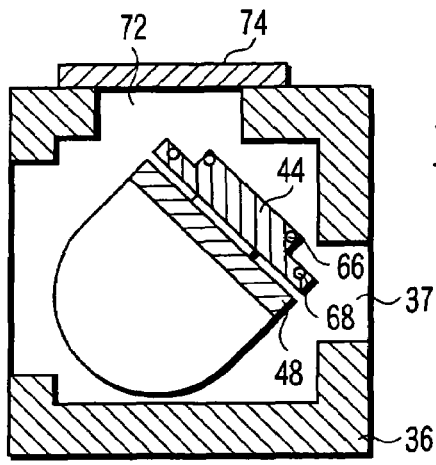
Figure 8D:
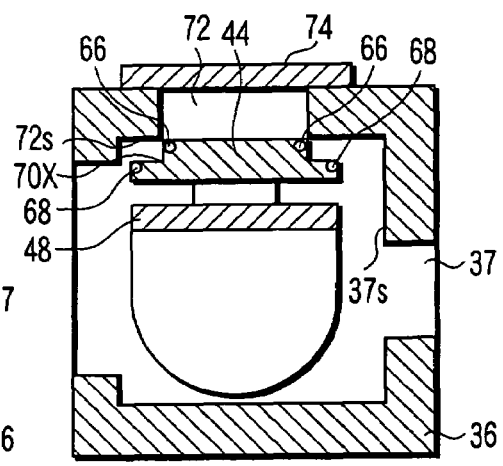
Figure 8E:
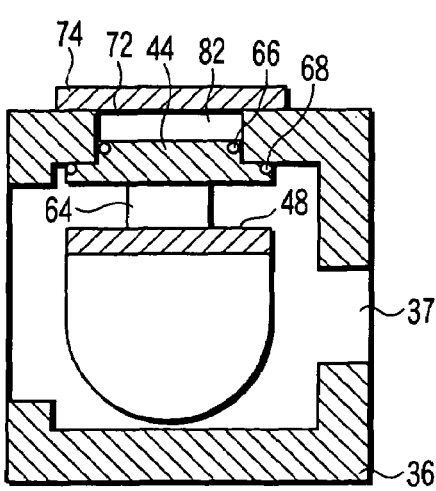
Figure 8F:
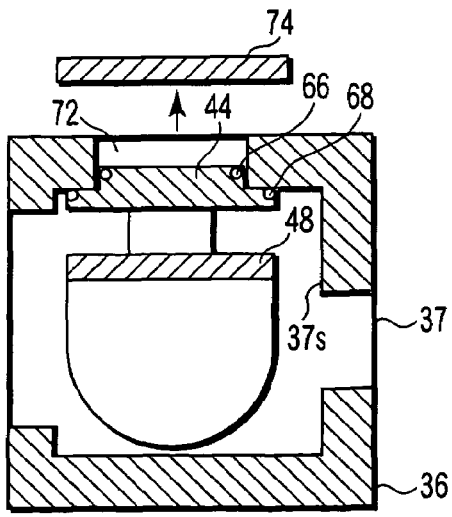

When the valve body 44 is seated on the transfer port 37, as shown in FIG. 8A, the first seal member 66 contacts the first valve seat 37s to effect sealing. At this time, the second seal member 68 provided on the stepped recess portion 70X is kept in a non-contact state. On the other hand, when the valve body 44 is seated on the maintenance port 72, the second seal member 68 contacts the second valve seat 72s and seals the maintenance port 72, while the first seal member 66 is exposed in the maintenance port 72.

Figure 9:
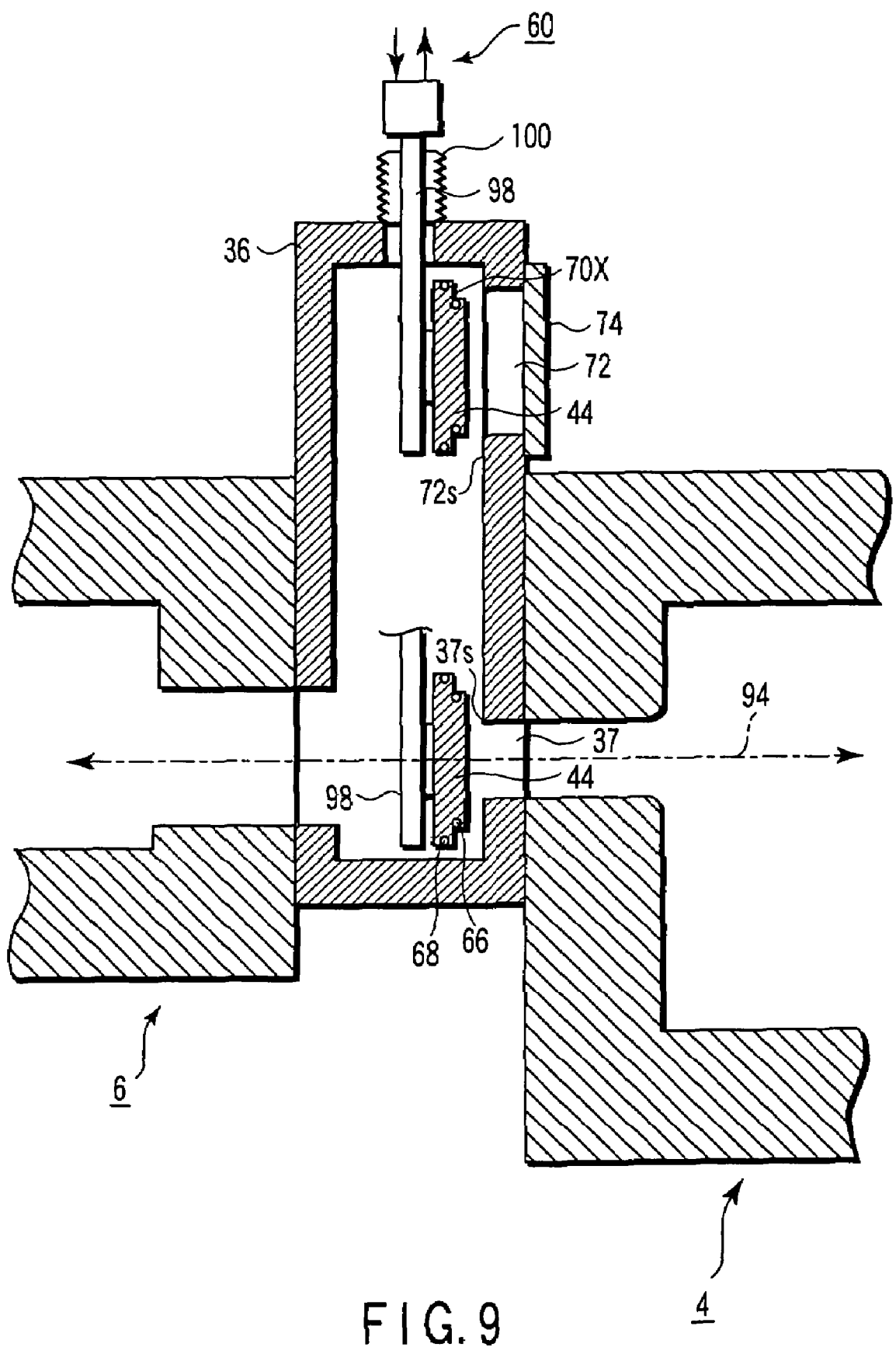
FIG. 9 is a cross-sectional view that shows a gate valve apparatus according to a third embodiment of the invention.

FIG. 9 is a cross-sectional view that shows a gate valve apparatus according to a third embodiment of the invention. FIG. 9 shows only main parts of the gate valve apparatus.

In the first and second embodiments, the base portion 48 of the driving mechanism 46 is configured to be rotatable. In the third embodiment, a base portion 98 is formed in a rod shape, and is configured to be vertically movable. A valve body 44 that is advancible/extendible is provided at a distal end portion of the base portion 98. The casing 36 is formed to have a rectangular cross-sectional shape, and is elongated upward. The rod-shaped base portion 98 penetrates a ceiling part of the casing 36 and is led out to the outside. A metallic extendible/retractable bellows 100 is provided at that part of the base portion 98, which penetrates the ceiling part of the casing 36. The bellows 100 maintains airtightness within the gate valve apparatus and permits vertical movement of the rod-shaped base portion 98.

A maintenance port 72 and a maintenance cover 74 are provided at a side wall of an upper part of the casing 36. In this case, the maintenance port 72 is vertically aligned with the transfer port 37.

In the third embodiment, the base portion 98 is vertically linearly moved to cause the valve body 44 to selectively face the transfer port 37 or maintenance port 72. When the wafer W is loaded/unloaded, the valve 44 is shifted upward in a standby state. In the third embodiment, the rotating mechanism is needless, and only the linear movement mechanism is required. Therefore, the structure of the apparatus can be more simplified.

The reason why the maintenance port 72 is positioned on the upper side of the process chamber 4 is that the upper side of the process chamber 4 generally has a wide space and allows easy replacement of the seal member. Depending on cases, the casing 36 may be elongated downward, and the maintenance port 72 may be provided on a lower side of the process chamber 4.

Figure 10:
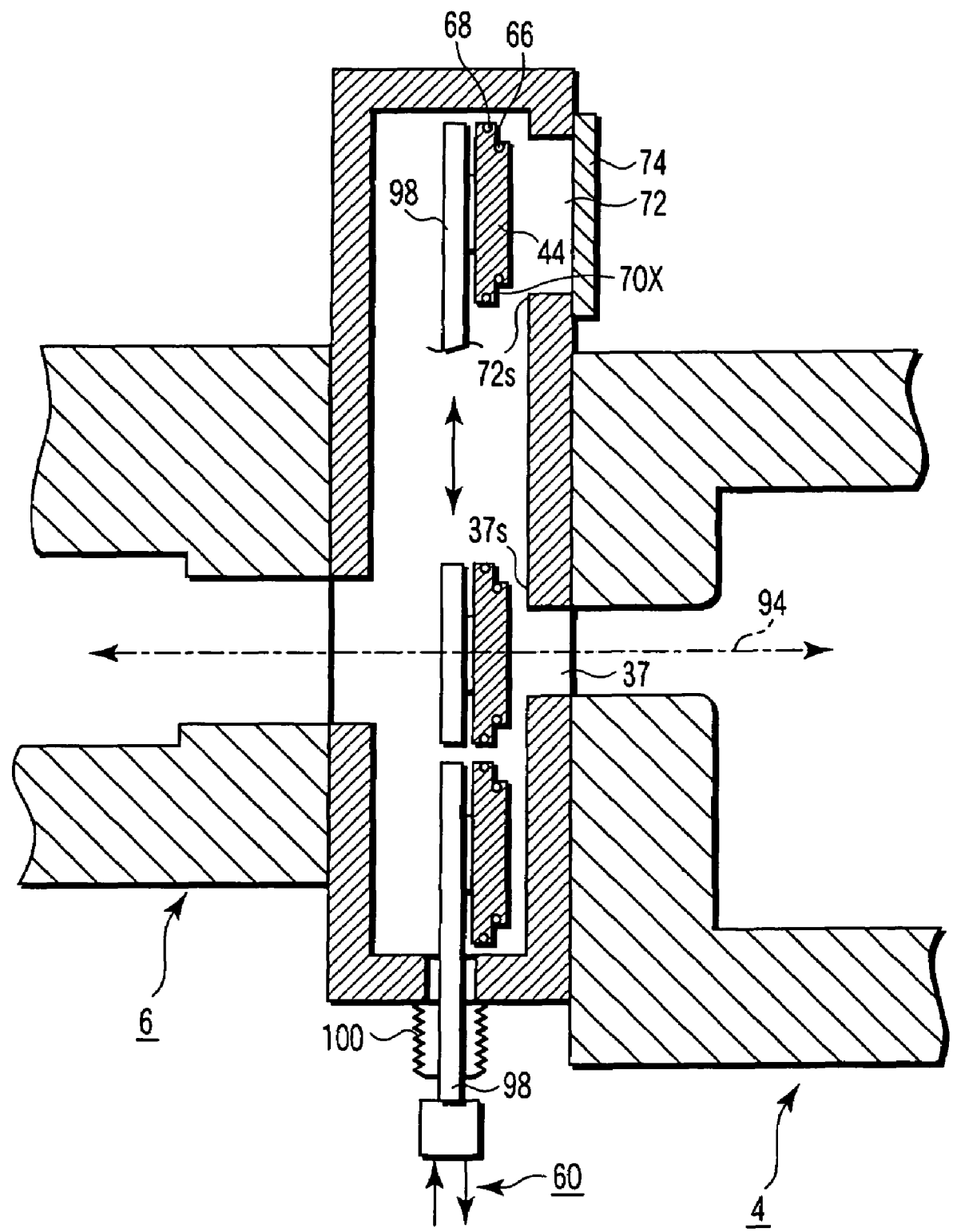
FIG. 10 is a cross-sectional view that shows a gate valve apparatus according to a fourth embodiment of the invention.

FIG. 10 is a cross-sectional view that shows a gate valve apparatus according to a fourth embodiment of the invention. FIG. 10 shows only main parts of the gate valve apparatus.

In the fourth embodiment, the casing 36 in the third embodiment shown in FIG. 9 is elongated downward, at least by a length corresponding to the height of the valve 44. The rod-shaped base portion 98 is disposed to penetrate a bottom part of the casing 36. In this case, when the wafer W is to be transferred between the transfer chamber 6 and process chamber 4, the valve body 44 is shifted to the lowermost position within the casing 36 so as not to interrupt the traveling locus 94 of the wafer W.

FIGS. 11A to 11E are views for explaining an operation of a gate valve apparatus according to a fifth embodiment of the present invention. FIGS. 11A to 11E show only main parts of the gate valve apparatus. The fifth embodiment is a modification of the above-described first and second embodiments.

In the fifth embodiment, the casing 36 has a substantially hexagonal cross-sectional shape, and not a substantially square cross-sectional shape. The rotatable base portion 48 has a substantially isosceles-triangular cross-sectional shape. Two valve bodies, that is, first and second valve bodies 44A and 44B, which are independently advancible/retractable, are disposed on the isosceles sides of the base portion 48 with the triangular cross section. An angle θ between the first and second valve bodies 44A and 44B with respect to the center of rotation is set at about 60°. In this case, reciprocators 52 are also disposed to be independently controllable in association with the first and second valve bodies 44A and 44B.

The valve body in the second embodiment shown in FIGS. 8A to 8F, that is, the valve body having the stepped recess portion 70X thereon, is used as each of the first and second valve bodies 44A and 44B. A first elongated maintenance port 72A and a second elongated maintenance port 72B are formed in those side portions of the casing 36 with the hexagonal cross section, which neighbor on both sides of the transfer port 37. First and second maintenance covers 74A and 74B are detachably attached on the maintenance ports 72A and 72B by means of bolts (not shown). Evacuation systems 88 and gas feeding systems 80, as shown in FIG. 2, are disposed at the first and second maintenance ports 72A and 72B.

Figure 11A:
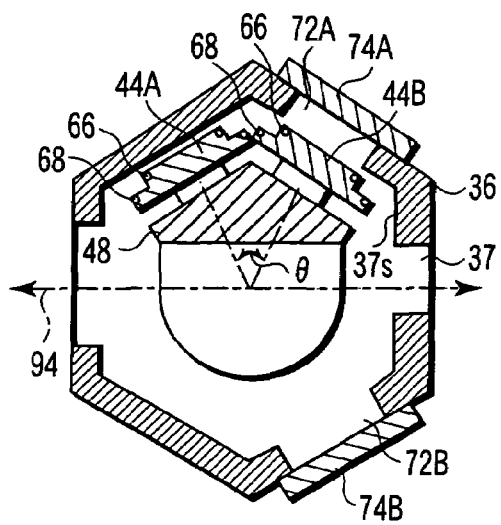
FIGS. 11A to 11E are views for explaining an operation of a gate valve apparatus according to a fifth embodiment of the present invention.
Figure 11B:
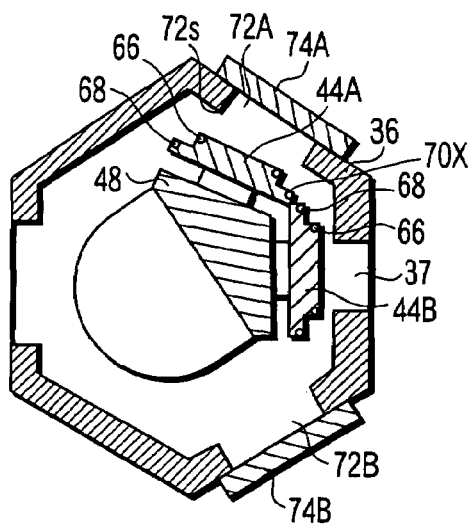
Figure 11C:
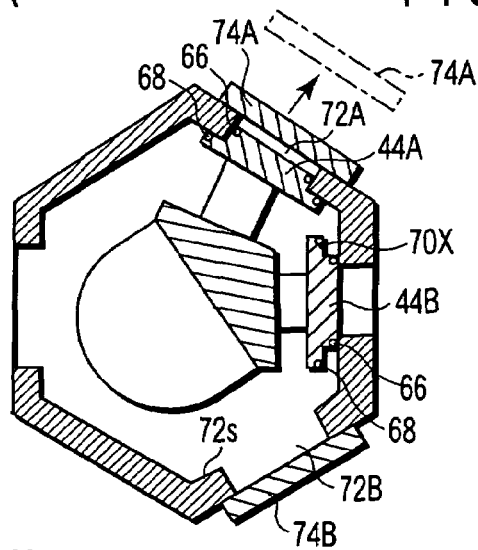
Figure 11D:
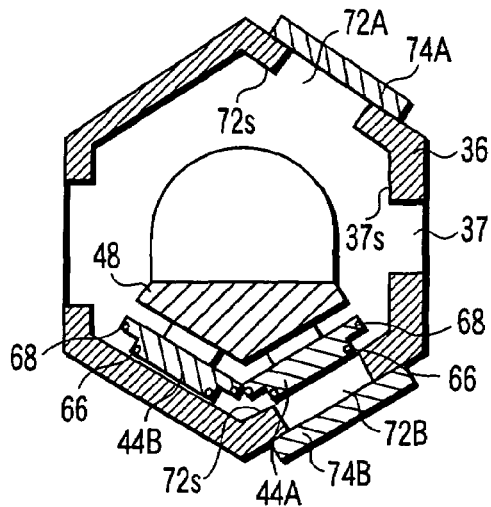
Figure 11E:
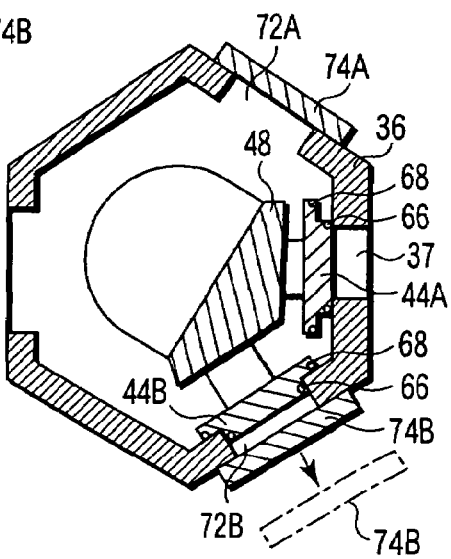

In the fifth embodiment, when the wafer W is passed, the base portion 48 is positioned as shown in FIG. 11A or 11D so as not to interrupt the traveling locus 94 of the wafer W. Specifically, both the first and second valve bodies 44A and 44B are retracted and, in this state, the first and second valve bodies 44A and 44B are turned upward or downward. When the base portion 48 is rotated, both the first and second valve bodies 44A and 44B are retracted, as shown in FIG. 11B, so as not to interfere with the inner walls.

When a process is performed, the first valve body 44A or second valve body 44B is seated on the transfer port 37, thereby sealing the transfer port 37 and keeping the inside of the process chamber 4 in the sealed state. Specifically, the first and second valve bodies 44A and 44B have equivalent functions. In FIG. 11C, the first valve body 44A is seated on the first maintenance port 72A. In FIG. 1E, the second valve body 44B is seated on the second maintenance port 72B. However, when the process is performed, there is no need to seat the valve body 44A, 44B on the maintenance port, and the valve bodies 44A and 44B are retracted.

Next, a description is given of the procedure for replacing the inner first seal members 66 on the first and second valve bodies 44A and 44B.

To begin with, when the inner first seal member 66 on the first valve body 44A is to be replaced, the second valve body 44B is seated on the transfer port 37, as shown in FIG. 1C, to seal the transfer port 37. On the other hand, the first valve body 44A is seated on the upper first maintenance port 72A to seal the maintenance port 72A. In this state, the first maintenance cover 74A is detached, and the first seal member 66 of the first valve body 44A is replaced with a new seal member.

When the inner first seal member 66 on the second valve body 44B is to be replaced, the first valve body 44A is seated on the transfer port 37, as shown in FIG. 1E, to seal the transfer port 37. On the other hand, the second valve body 44B is seated on the lower second maintenance port 72B to seal the maintenance port 72B. In this state, the second maintenance cover 74B is detached, and the first seal member 66 of the second valve body 44B is replaced with a new seal member.

In the fifth embodiment, even when the process is being performed in the process chamber 4 or when the maintenance is being performed by opening the process chamber 4 to the outside air, the first seal member 66 can be replaced regardless of the pressure condition within in the process chamber 4. In particular, in order to avoid cross-contamination between the process chambers 4A to 4D, it is necessary to prevent such a situation from occurring that a plurality of process chambers are opened to the transfer chamber 6 at the same time. In this case, in the fifth embodiment, the transfer chamber 6 is prevented from communicating with the process chamber 4, and the whole system including the gate valve apparatus can be kept in the vacuum state. Therefore, the fifth embodiment using the two valve bodies can particularly advantageously be applied to the above-described case.

Figure 12A:
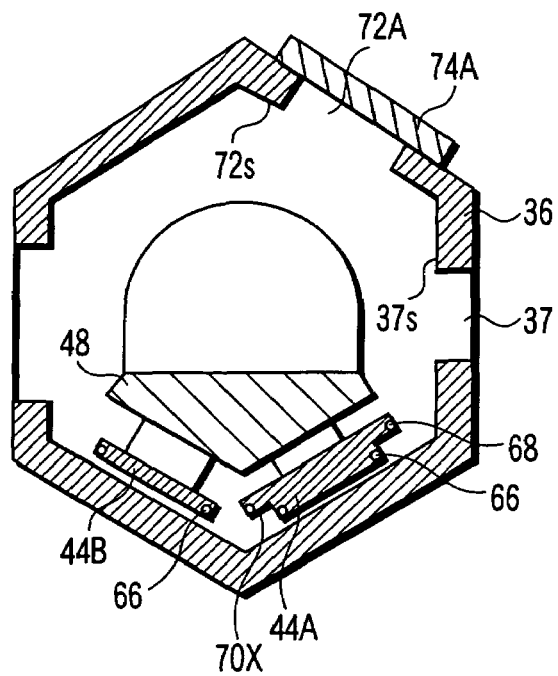
FIGS. 12A to 12C are views for explaining an operation of a gate valve apparatus according to a sixth embodiment of the present invention.
Figure 12B:
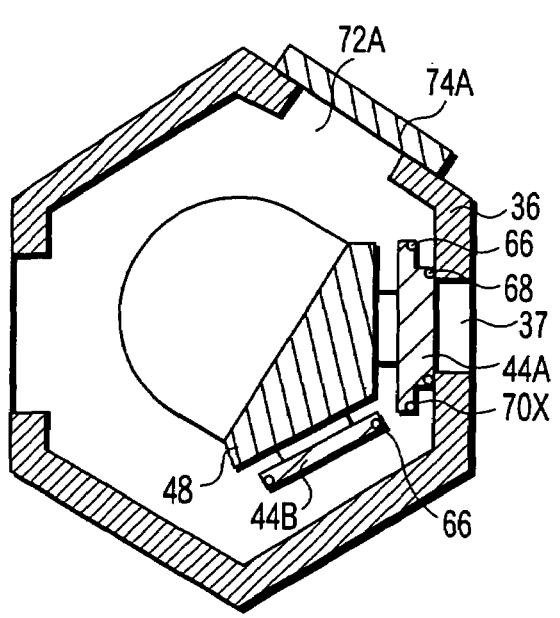
Figure 12C:
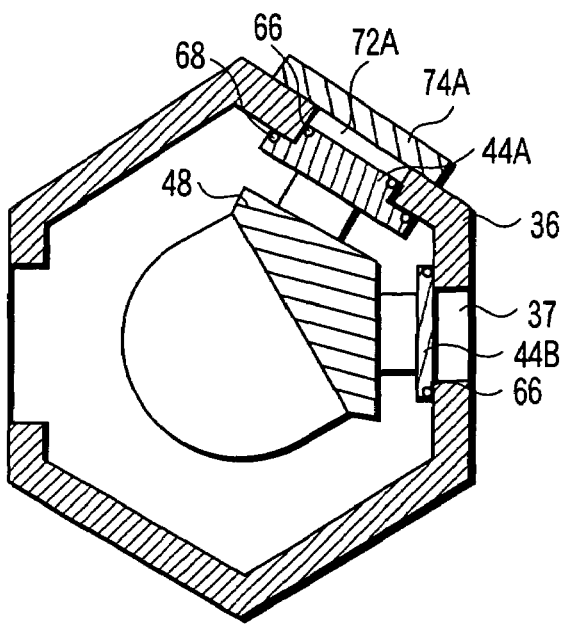

FIGS. 12A to 12C are views for explaining an operation of a gate valve apparatus according to a sixth embodiment of the present invention. FIGS. 12A to 12C show only main parts of the gate valve apparatus. The sixth embodiment is a modification of the fifth embodiment shown in FIGS. 11A to 11E.

In the sixth embodiment, a first valve body 44A and a second valve body 44B have different structures. One of the two valve bodies, for instance, the first valve body 44A, is provided with a first seal member 66, a stepped recess portion 70X and a second seal member 68. The other valve body, that is, the second valve body 44B, is provided with a first seal member 66, but is not provided with a stepped recess portion 70X or a second seal member 68. In other words, the second valve body 44B is a flat-plate valve body as shown in FIG. 2, without the second seal member 68 being provided. At the time of performing a process or at the time of cleaning, the first valve body 44A is principally used to seal the transfer port 37.

As is shown in FIG. 12C, when the first valve body 44A is seated on the maintenance port 72A in order to replace the first seal member 66 of the first valve body 44A, the second valve body 44B is seated on the transfer port 37 to seal the transfer port 37. In this embodiment, the first seal member 66 of the second valve body 44B is hardly degraded, and it requires no replacement. Therefore, there is no need to provide the casing 36 with the second maintenance port 72B that is provided in the fifth embodiment shown in FIGS. 11A to 11E. When the base portion 48 is rotated, both the first and second valve bodies 44A and 44B are retracted, as shown in FIG. 12A. In the sixth embodiment, too, the same advantageous effects as with the fifth embodiment can be obtained.

FIGS. 13A to 13C are views for explaining an operation of a gate valve apparatus according to a seventh embodiment of the present invention. FIGS. 13A to 13C show only main parts of the gate valve apparatus. The seventh embodiment is mainly a combination of the fifth embodiment shown in FIGS. 11A to 11E and the sixth embodiment shown in FIGS. 12A to 12C.

In the seventh embodiment, a left half of the casing 36 is directly coupled to the transfer chamber 6 in the open state. First and second valve bodies 44A and 44B have the same structures as the two valve bodies 44A and 44B used in the fifth embodiment. The casing 36 is provided with the first maintenance port 74A, but is not provided with the second maintenance port, as in the sixth embodiment shown in FIGS. 12A to 12C. In the seventh embodiment, too, the same advantageous effects as with the sixth embodiment shown in FIGS. 12A to 12C can be obtained.

Figure 14:
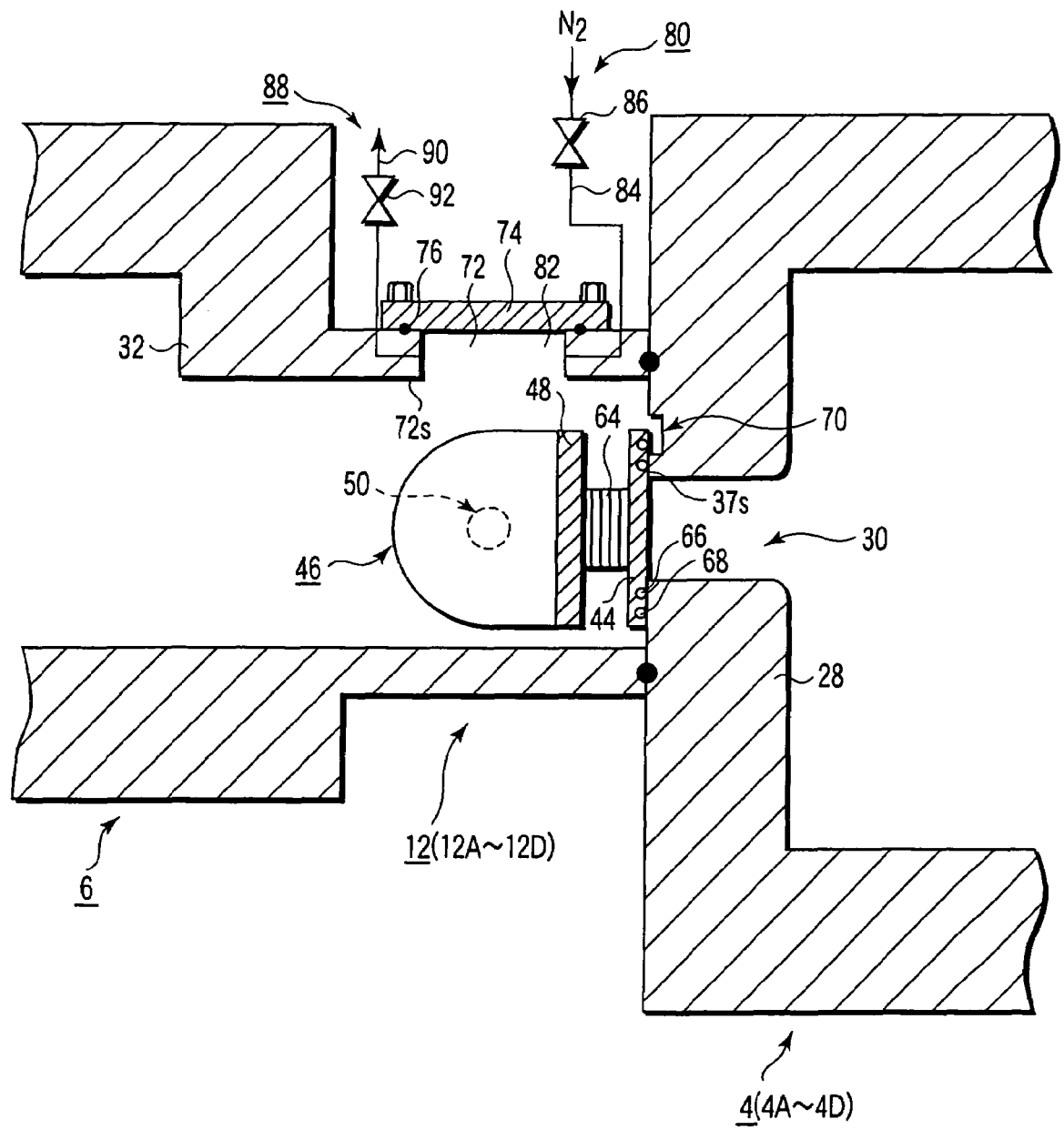
FIG. 14 is a cross-sectional view that shows a gate valve apparatus according to an eighth embodiment of the invention.

FIG. 14 is a cross-sectional view that shows a gate valve apparatus according to an eighth embodiment of the invention. In the gate valve apparatus according to each of the first to seventh embodiments, the casing 36, base portion 48, valve body 44, etc. are constructed as a unit that is detachably attached to the vacuum processing system. On the other hand, in the eighth embodiment, a side wall of a neighboring chamber also serves as a part of the surrounding wall that defines the transfer space of the gate valve apparatus.

For example, as shown in FIG. 14, a part of the side wall of the process chamber 4 provides the function of the wall of the above-described casing 36 on the transfer port 37 side. In addition, a part of the side wall of the transfer chamber 6 provides the function of the other wall of the casing 36. Specifically, the valve body 44, base portion 48, etc. are accommodated within an end portion of the transfer chamber 6, and a distal end of this end portion is coupled to the side wall 28 of the process chamber 4. Accordingly, a first valve seat 37s is defined by the outer surface of the side wall 28 that defines the transfer port 30, and the valve body 44 is directly seated on the first valve seat 37s. Besides, a recess portion 70 for protecting the second seal member 68 is formed in the outer surface of the side wall 28.

In the above-described embodiments, the semiconductor wafer has been described as an example of the target object. However, the present invention is also applicable to a glass substrate, an LCD substrate, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A gate valve apparatus of a vacuum processing system, comprising:
a surrounding wall that defines a transfer space for a target object to pass therethrough;
a transfer port formed in the surrounding wall for the target object to pass therethrough;
a first valve seat defined by a part of the surrounding wall, which surrounds the transfer port;
a valve body disposed to be movable within the surrounding wall and to open/close the transfer port;
a first seal member disposed on the valve body to engage with the first valve seat; a maintenance port formed in the surrounding wall to perform maintenance of the first seal member;
a second valve seat defined by a part of the surrounding wall, which surrounds the maintenance port;
a second seal member disposed on the valve body to engage with the second valve seat, the second seal member surrounding the first seal member;
a maintenance cover detachably attached on an outside of the surrounding wall to close the maintenance port; and
a driving mechanism that drives the valve body within the surrounding wall.

2. The apparatus according to claim 1, wherein a recess portion is formed in the surrounding wall such that the recess portion surrounds the first valve seat, and the recess portion is configured to avoid contact between the second seal member and the surrounding wall when the transfer port is closed by the valve body.

3. The apparatus according to claim 1, wherein a stepped recess portion is formed on the valve body such that the stepped recess portion surrounds the first seal member, the second seal member is provided on the stepped recess portion, and the stepped recess portion is configured to prevent contact between the second seal member and the surrounding wall when the transfer port is closed by the valve body.

4. The apparatus according to claim 1, further comprising a gas feeding system and an evacuation system that are connected to the maintenance port to adjust a pressure in a space defined between the maintenance cover and the valve body when the second seal member is put in close contact with the second valve seat.

5. The apparatus according to claim 1, wherein the driving mechanism includes a base portion that supports the valve body, the driving mechanism moves the base portion between a first position where the valve body faces the transfer port and a second position where the valve body faces the maintenance port, and the driving mechanism advances and retracts the valve body on the base portion.

6. The apparatus according to claim 5, wherein the driving mechanism rotates the base portion between the first position and the second position.

7. The apparatus according to claim 5, wherein the driving mechanism linearly moves the base portion between the first position and the second position.

8. The apparatus according to claim 5, wherein the driving mechanism includes a lock mechanism for locking the base portion at a position.

9. The apparatus according to claim 6, wherein the base portion is set such that in the second position the base portion is free from interference with the target object that passes within the transfer space through the transfer port.

10. The apparatus according to claim 5, further comprising: a second valve body supported on the base portion to open/close the transfer port; and a third seal member disposed on the second valve body to engage with the first valve seat, wherein the second valve body faces the transfer port in the second position of the base portion where the valve body faces the maintenance port.

11. The apparatus according to claim 10, further comprising a fourth seal member disposed on the second valve body to engage with the second valve seat, the fourth seal member surrounding the third seal member.

12. The apparatus according to claim 5, further comprising:
a second valve body supported on the base portion to open/close the transfer port;
a third seal member disposed on the second valve body to engage with the first valve seat; a second maintenance port formed in the surrounding wall to perform maintenance of the third seal member;

a third valve seat defined by a part of the surrounding wall, which surrounds the second maintenance port;

a fourth seal member disposed on the second valve body to engage with the third valve seat, the fourth seal member surrounding the third seal member; and a second maintenance cover detachably attached on an outside of the surrounding wall to close the second maintenance port, wherein the second valve body faces the second maintenance port in the first position of the base portion where the valve body faces the transfer port.

13. The apparatus according to claim 1, wherein the maintenance cover comprises a transparent plate.

14. The apparatus according to claim 1, wherein the maintenance cover includes a viewing window for visual recognition of an inside of the surrounding wall.

15. The apparatus according to claim 1, wherein the surrounding wall and the valve body are constructed as a unit detachably mounted, as one piece, in the vacuum processing system.

16. The apparatus according to claim 1, wherein a side wall of a neighboring chamber also serves as a part of the surrounding wall.

17. A gate valve apparatus to be disposed in a surrounding wall that defines a transfer space for a target object to pass therethrough, in a vacuum processing system, wherein the surrounding wall comprises a transfer port formed in the surrounding wall for the target object to pass therethrough, a first valve seat defined by a part of the surrounding wall, which surrounds the transfer port, a maintenance port formed in the surrounding wall to perform maintenance of the gate valve apparatus, a second valve seat defined by a part of the surrounding wall, which surrounds the maintenance port, and a maintenance cover detachably attached on an outside of the surrounding wall to close the maintenance port, the gate valve apparatus comprising:

a valve body disposed to be movable within the surrounding wall and to open/close the transfer port; a first seal member disposed on the valve body to engage with the first valve seat;

a second seal member disposed on the valve body to engage with the second valve seat, the second seal member surrounding the first seal member; and a driving mechanism configured to drive the valve body within the surrounding wall.

* * * * *